(12) United States Patent
Demars et al.

(10) Patent No.: US 12,520,447 B2
(45) Date of Patent: Jan. 6, 2026

(54) MOUNTING INTERFACE FOR LIQUID MANIFOLD AND ELECTRONICS RACK

(71) Applicant: Hoffman Enclosures Inc., Anoka, MN (US)

(72) Inventors: Allen Demars, Elk River, MN (US); Scott Stammer, Champlin, MN (US)

(73) Assignee: Hoffman Enclosures, Inc., Anoka, MN (US)

( * ) Notice: Subject to any disclaimer, the term of this patent is extended or adjusted under 35 U.S.C. 154(b) by 297 days.

(21) Appl. No.: 18/042,969

(22) PCT Filed: Aug. 31, 2021

(86) PCT No.: PCT/US2021/048375
§ 371 (c)(1),
(2) Date: Feb. 24, 2023

(87) PCT Pub. No.: WO2022/047360
PCT Pub. Date: Mar. 3, 2022

(65) Prior Publication Data
US 2023/0354543 A1     Nov. 2, 2023

Related U.S. Application Data

(60) Provisional application No. 63/072,599, filed on Aug. 31, 2020.

(51) Int. Cl.
*H05K 7/20*     (2006.01)
*H05K 7/14*     (2006.01)

(52) U.S. Cl.
CPC ....... *H05K 7/1489* (2013.01); *H05K 7/20272* (2013.01); *H05K 7/20763* (2013.01)

(58) Field of Classification Search
CPC ................... H05K 7/20272; H05K 7/20763
See application file for complete search history.

(56) References Cited

U.S. PATENT DOCUMENTS

| | | | |
|---|---|---|---|
| 6,095,345 | A | 8/2000 | Gibbons |
| 6,774,275 | B2 | 8/2004 | Smith, Jr. et al. |
| 6,857,283 | B2 | 2/2005 | Tilton et al. |

(Continued)

FOREIGN PATENT DOCUMENTS

| | | |
|---|---|---|
| CN | 109413640 A | 3/2019 |
| CN | 209472935 U | 10/2019 |

(Continued)

*Primary Examiner* — Anthony Q Edwards
(74) *Attorney, Agent, or Firm* — Quarles & Brady LLP (57) ABSTRACT

A server rack assembly is provided for an electronics tray and a manifold for delivery of cooling flow to the electronics tray. Mounting and alignment features on the server rack assembly, such as alignment holes and planar support surfaces, can help to provide predictable alignment between fluid ports on the manifold and fluid ports on the electronics tray. The server rack assembly can include a mounting and alignment interface coupled to the manifold and a rack support that can be coupled to the mounting and alignment interface. An equipment stop can be coupled to the rack support and can extend perpendicular to a side portion of the rack support. The equipment stop can be configured to prevent the electronics tray from being installed beyond a predetermined distance.

20 Claims, 6 Drawing Sheets

(56) References Cited

U.S. PATENT DOCUMENTS

| | | | |
|---|---|---|---|
| 6,880,350 B2 | 4/2005 | Tilton | |
| 6,889,509 B1 | 5/2005 | Cader et al. | |
| 6,901,138 B2 | 5/2005 | Kim | |
| 6,988,725 B2 | 1/2006 | Rapkin | |
| 6,996,996 B1 | 2/2006 | Cader | |
| 7,013,662 B1 | 3/2006 | Tilton et al. | |
| 7,021,067 B1 | 4/2006 | Tilton et al. | |
| 7,032,403 B1 | 4/2006 | Tilton et al. | |
| 7,094,589 B2 | 8/2006 | Curtis et al. | |
| 7,288,693 B2 | 10/2007 | Smith, Jr. et al. | |
| 7,308,801 B1 | 12/2007 | Tilton et al. | |
| 7,401,471 B1 | 7/2008 | Tilton | |
| 7,408,775 B2 * | 8/2008 | Walz | H05K 7/20645 |
| | | | 361/689 |
| 7,490,478 B1 | 2/2009 | Tilton | |
| 7,506,519 B1 | 3/2009 | Tilton et al. | |
| 7,639,486 B2 | 12/2009 | Champion et al. | |
| 7,692,924 B2 | 4/2010 | Wavering et al. | |
| 8,305,754 B2 | 11/2012 | Wu et al. | |
| 8,405,983 B2 | 3/2013 | Chen | |
| 8,602,372 B2 | 12/2013 | Yu et al. | |
| 8,608,258 B2 | 12/2013 | Korikawa | |
| 8,654,532 B2 | 2/2014 | Chen et al. | |
| 8,820,351 B1 | 9/2014 | Harrington et al. | |
| 9,292,057 B2 | 3/2016 | Cox et al. | |
| 9,351,428 B2 | 5/2016 | Eckberg et al. | |
| 9,354,676 B2 | 5/2016 | Shelnutt et al. | |
| 9,451,726 B2 | 9/2016 | Regimbal et al. | |
| 9,655,281 B2 | 5/2017 | Harvilchuck et al. | |
| 9,668,383 B2 | 5/2017 | Cox et al. | |
| 9,832,913 B2 | 11/2017 | Shedd | |
| 9,848,509 B2 | 12/2017 | Shedd et al. | |
| 9,848,514 B2 | 12/2017 | Shelnutt et al. | |
| 9,852,963 B2 | 12/2017 | Shedd et al. | |
| 9,854,713 B2 | 12/2017 | Krug, Jr. et al. | |
| 9,854,715 B2 | 12/2017 | Shedd et al. | |
| 9,861,012 B2 | 1/2018 | Krug, Jr. et al. | |
| 9,891,002 B2 | 2/2018 | Shedd et al. | |
| 9,901,008 B2 | 2/2018 | Shedd et al. | |
| 9,901,013 B2 | 2/2018 | Shedd et al. | |
| 9,918,408 B2 | 3/2018 | Regimbal et al. | |
| 10,185,375 B2 | 1/2019 | Franz et al. | |
| 10,813,253 B2 | 10/2020 | Lunsman et al. | |
| 2003/0096545 A1 | 5/2003 | Payne | |
| 2003/0194068 A1 | 10/2003 | Kim | |
| 2004/0007798 A1 | 1/2004 | Kreager et al. | |
| 2004/0086922 A1 | 5/2004 | Curtis et al. | |
| 2004/0204622 A1 | 10/2004 | Smith, Jr. et al. | |
| 2004/0251611 A1 | 12/2004 | Rapkin | |
| 2004/0265465 A1 | 12/2004 | Daniels et al. | |
| 2007/0256957 A1 | 11/2007 | Herrmann et al. | |
| 2008/0066889 A1 | 3/2008 | Knight et al. | |
| 2014/0240920 A1 * | 8/2014 | Cox | H05K 7/20781 |
| | | | 361/679.53 |
| 2015/0009620 A1 | 1/2015 | Kadotani et al. | |
| 2015/0077930 A1 | 3/2015 | Kadotani et al. | |
| 2015/0208551 A1 | 7/2015 | Davidson | |
| 2016/0066480 A1 * | 3/2016 | Eckberg | F16L 37/34 |
| | | | 361/679.53 |
| 2016/0270260 A1 * | 9/2016 | Franz | H05K 7/20781 |
| 2017/0164504 A1 | 6/2017 | Blume | |
| 2017/0181329 A1 * | 6/2017 | Shelnutt | H05K 7/20781 |
| 2017/0202114 A1 | 7/2017 | Davidson | |
| 2019/0124797 A1 * | 4/2019 | Norton | H05K 7/20172 |
| 2019/0150323 A1 | 5/2019 | Krug, Jr. et al. | |
| 2019/0269039 A1 | 8/2019 | Harvilchuck et al. | |
| 2020/0029469 A1 * | 1/2020 | McCordic | H05K 7/20645 |
| 2020/0077541 A1 * | 3/2020 | Sharf | G02B 6/4268 |
| 2020/0178413 A1 | 6/2020 | Thibaut et al. | |
| 2020/0191504 A1 * | 6/2020 | Chen | F28F 9/0258 |
| 2021/0307208 A1 * | 9/2021 | Shao | H05K 7/20272 |
| 2022/0015270 A1 * | 1/2022 | Miyamura | H05K 7/20272 |
| 2022/0201896 A1 * | 6/2022 | Edmunds | H05K 7/20254 |
| 2023/0061298 A1 * | 3/2023 | Gao | G01M 3/38 |

FOREIGN PATENT DOCUMENTS

| | | |
|---|---|---|
| CN | 210491462 U | 5/2020 |
| WO | 2019/000082 A1 | 1/2019 |

* cited by examiner

MOUNTING INTERFACE FOR LIQUID MANIFOLD AND ELECTRONICS RACK

CROSS-REFERENCE TO RELATED APPLICATIONS

This application is the national stage entry of PCT International Application No. PCT/2021/048375, filed Aug. 31, 2021, which claims the benefit of U.S. Provisional Patent Application No. 63/072,599, filed Aug. 31, 2020, the entireties of which are incorporated herein by reference for all purposes.

BACKGROUND

In some cooling system applications, a manifold may deliver flows of cooling fluid to and from electronics supported on a rack within a cabinet or stack. For example, some liquid cooling systems can include manifolds that allow pumped fluid to individually cool multiple server trays that are stacked vertically within a server rack or other arrangement. In such systems, avoiding leakage of cooling fluid in the vicinity of the electronics that are to be cooled may be important.

SUMMARY

Some embodiments of the invention provide a server rack assembly for supporting an electronics tray and aligning the electronics tray with a manifold for delivery of cooling flow to the electronics tray. The manifold can include at least one fluid port. The server rack assembly can include a mounting and alignment interface coupled to the manifold. The mounting and alignment interface can have a first planar portion with an alignment hole configured to receive the at least one fluid port therethrough. A rack support can be coupled to the mounting and alignment interface. The rack support can have a support shelf configured to receive the electronics tray thereon and a side portion extending perpendicularly from and along the support shelf. An equipment stop can be coupled to the rack support and can extend perpendicular to the side portion of the rack support. The equipment stop can be configured to prevent the electronics tray from being installed beyond a predetermined distance.

In some embodiments, the mounting and alignment interface can be directly coupled to the manifold.

In some embodiments, the mounting and alignment interface and the rack support can be formed from a unitary metal body.

In some embodiments, the mounting and alignment interface can have a second planar portion extending alongside the manifold in a direction opposite the rack support. In some embodiments, the manifold can include a protrusion extending outwardly perpendicular to the fluid port and the second planar portion can include a placement feature configured to receive the protrusion. In some embodiments, the protrusion can be threaded and can be configured to be threadably engageable with a nut and the second planar portion can be urged against the manifold by the threaded engagement of the nut and the protrusion.

In some embodiments, the mounting and alignment interface can be coupled directly to the fluid port.

Some embodiments of the invention provide a server rack assembly for supporting an electronics tray and aligning the electronics tray with a manifold for delivery of cooling flow to the electronics tray. The manifold can include at least one fluid port. The server rack assembly can include a mounting and alignment interface with a first planar portion that can be configured to be coupled directly to at least one of the manifold or the at least one fluid port. A rack support can be coupled to the mounting and alignment interface. The rack support can have a support shelf configured to receive the electronics tray. The mounting and alignment interface and the rack support can be configured to align and secure the electronics tray with a known spacing, along three Cartesian axes, relative to the at least one fluid port to ensure appropriate connection of a fluid port on the electronics tray to the at least one fluid port on the manifold.

In some embodiments, the mounting and alignment interface and the rack support can be made from a unitary piece of material. In some embodiments, the mounting and alignment interface can have a second planar portion extending alongside the manifold in a direction opposite the rack support. In some embodiments, the second planar portion of the mounting and alignment interface can have an aperture configured to receive a protrusion extending outwardly from the manifold. In some embodiments, the protrusion can be threaded and can be configured to be threadably engageable with a nut and the second planar portion can be urged against the manifold by the threaded engagement of the nut and the protrusion.

In some embodiments, the rack support can have a side portion extending perpendicularly from and along the support shelf and an equipment stop coupled to and extending perpendicularly from the side portion. The equipment stop can be configured to prevent the electronics tray from being installed beyond a predetermined distance. In some embodiments, the rack support can be configured to be coupled to the mounting and alignment interface with a set of fasteners received within respective sets of placement apertures in the rack support and the mounting and alignment interface. In some embodiments, the sets of placement apertures of the rack support and the mounting and alignment interface can be spaced apart in a staggered pattern. In some embodiments, the rack support can have a window in the side portion located adjacent the at least one fluid port when the server rack is coupled to the manifold.

Some embodiments of the invention provide a server rack assembly for supporting an electronics tray. The server rack assembly can include a manifold with a fluid port extending outward therefrom and configured to be compatible with a fluid port on the electronics tray. A mounting and alignment interface can be coupled to the manifold. The mounting and alignment interface can have an alignment hole configured to receive the fluid port of the manifold therethrough. A rack support can be coupled to the mounting and alignment interface. The rack support can have a support shelf configured to receive the electronics tray thereon. The mounting and alignment interface and the rack support can be configured to align the fluid port of the manifold with the fluid port of the electronics tray during installation of the electronics tray on the rack support.

In some embodiments, the rack support can have a side portion extending perpendicularly from and along the support shelf and an equipment stop coupled to and extending perpendicularly from the side portion, the equipment stop configured to prevent the electronics tray from being installed on the rack support beyond a predetermined distance. In some embodiments, the mounting and alignment interface can be directly coupled to the fluid port of the manifold. In some embodiments, the manifold can have a protrusion that is configured to be received within an aperture of the mounting and alignment interface to place the rack support at a predetermined location relative to the fluid port of the manifold to ensure alignment with the fluid port of the electronics tray.

BRIEF DESCRIPTION OF THE DRAWINGS

The accompanying drawings, which are incorporated in and form a part of this specification, illustrate embodiments of the invention and, together with the description, serve to explain the principles of embodiments of the invention.

DETAILED DESCRIPTION

Before any embodiments of the invention are explained in detail, it is to be understood that the invention is not limited in its application to the details of construction and the arrangement of components set forth in the following description or illustrated in the following drawings. The invention is capable of other embodiments and of being practiced or of being carried out in various ways. Also, it is to be understood that the phraseology and terminology used herein is for the purpose of description and should not be regarded as limiting. The use of "including," "comprising," or "having" and variations thereof herein is meant to encompass the items listed thereafter and equivalents thereof as well as additional items. Unless specified or limited otherwise, the terms "mounted," "connected," "supported," and "coupled" and variations thereof are used broadly and encompass both direct and indirect mountings, connections, supports, and couplings. Further, "connected" and "coupled" are not restricted to physical or mechanical connections or couplings.

The following discussion is presented to enable a person skilled in the art to make and use embodiments of the invention. Various modifications to the illustrated embodiments will be readily apparent to those skilled in the art, and the generic principles herein can be applied to other embodiments and applications without departing from embodiments of the invention. Thus, embodiments of the invention are not intended to be limited to embodiments shown, but are to be accorded the widest scope consistent with the principles and features disclosed herein. The following detailed description is to be read with reference to the figures, in which like elements in different figures have like reference numerals. The figures, which are not necessarily to scale, depict selected embodiments and are not intended to limit the scope of embodiments of the invention. Skilled artisans will recognize the examples provided herein have many useful alternatives and fall within the scope of embodiments of the invention.

Some of the discussion below describes interfaces that can be used to help provide liquid cooling to server racks. The context and particulars of this discussion are presented as examples only. For example, embodiments of the disclosed invention can be used in other contexts, such as for cooling computing equipment other than servers, or various other electronics, configured in various ways, including with other shapes and arrangements of elements.

When liquid flows are used to cool electronics, it may be useful to allow for quick, blind connection of flow paths in assemblies to be cooled and flow paths within manifolds that provide the cooling flows. For example, a server or other electronics assembly can be configured to be readily (e.g., partly automatically) aligned for connection to a flow system for liquid cooling of server racks as the assembly is moved into position for operation. This may allow operators to ensure secure attachment of fluid couplings without manual engagement of the couplings or particular attention to alignment of the various components during installation.

Conventional arrangements for liquid cooling can include manifolds for fluid delivery that are equipped with quick-connect fluid couplings. With these types of fluid couplings, blind connections with reliably leak proof operation can be obtained, provided that opposing sides of the couplings (e.g., on a manifold and on a server assembly) are appropriately aligned.

However, conventional approaches for construction of server racks and cooling manifolds may result in substantial variations in relevant dimensions, which can have substantial detrimental effects on alignment between associated components. For example, many conventional systems use manifolds and electronics racks that are manufactured from formed (e.g., bent and stamped or laser cut) sheet metal. These and other systems can exhibit substantial dimensional variances as a potentially unavoidable consequence of these manufacturing techniques. Accordingly, for example, it may be difficult in conventional systems to ensure appropriate alignment and, correspondingly, fluid connection, between opposing sides of fluid couplings. This may be problematic due to the effects of exposing electronics to certain liquids (e.g., water). And, even if leaks are avoided, failure to appropriately secure couplings for fluid transfer can result in poor performance of the relevant electronics, including due to a lack of adequate flow of cooling fluid.

Considerations beyond dimensional variation can also complicate the task of making secure and predictable connection at fluid couplings for liquid cooling. For example, pressure of fluid flow at fluid couplings can tend to urge the couplings to separate, with corresponding forces on associated manifolds and electronics racks. Additionally, many quick-connection couplings utilize spring-loaded components. The forces of the springs can also impose substantial forces on manifolds and electronics racks, particularly for non-locking connections in which spring forces may not be absorbed by locking devices during system operation. In this regard, for example, some manifolds may be subject to lateral loading of 800 pounds or more during operation. Such loading can also create (or exacerbate) problems with misalignment of components, including for manifolds that may be secured to larger support structures only at limited connection points.

Embodiments of the invention can address these or other issues by helping to ensure appropriately aligned engagement between liquid ports on cooling manifolds and on electronics assemblies, regardless of large manufacturing tolerances in structural components. For example, in some embodiments, mounting features can be provided on a manifold that positively engage corresponding mounting features on an electronics tray in order to predictably align the electronics tray relative to fluid ports on the manifold. With known placement of fluid ports on the rack support (e.g., as part of quick-connect couplings), the mounting features can thus help to ensure alignment for connection of the rack support and manifold fluid ports for cooling operations. Additionally, by anchoring aligned racks to cooling manifolds, some embodiments can distribute reaction forces from fluid couplings across multiple locations along an elongate axis of a manifold, and can thereby help to reduce manifold deflection while simultaneously distributing some portion of the reaction forces to the rack support. In some embodiments, the bending stress imparted on the manifold assembly can be reduced by decoupling the connection forces from the manifold tube, including by instead distributing the forces onto or across the rack support. Reducing the forces imparted on the manifold can allow for the use of lighter gauge manifold materials that can reduce the cost of manufacturing as well as helping to ensure easy and reliable engagement of electronic trays for cooling.

As used herein, unless otherwise limited, a "fluid port" means any feature that provides a transition into or out of a particular system along a fluid particular flow path. Thus, for example, a fluid port can include simple openings in structures that are configured for fluid flow, or more complex mechanisms such as fluid couplings (e.g., a quick-connect coupling).

In some cases, a structural support can be welded to a face of the manifold from which the fluid ports extend. The structural support can include holes through which the fluid ports are received. A rack support can be coupled to the structural support at predetermined locations there along to predictably align the rack support relative to fluid ports on the manifold.

In some embodiments, rack supports can be attached to fluid ports along the manifold. By mounting the rack supports to the fluid ports, each rack support is able to be aligned with a corresponding fluid port regardless of large manufacturing tolerances in structural components. Further, the forces of the springs in the quick-connection couplings during connection and the pressure of fluid flow at fluid couplings that can tend to urge the couplings to separate or otherwise misalign relevant components can be mitigated by the attachment of the rack support to the fluid port, because force is distributed through the structural components, not the manifold.

In some cases, mounting features on a manifold can include protrusions extending from a wall of a manifold. The protrusions can exhibit a predetermined spaced relationship with a set of fluid ports on the manifold and can be configured to help locate a rack support relative to the manifold and a particular port. When the electronics tray is installed on a support surface of a rack support for cooling via the manifold, the protrusions help ensure predictable first-axis alignment between the support surface of the rack support and the fluid ports of the manifold.

Figure 1:
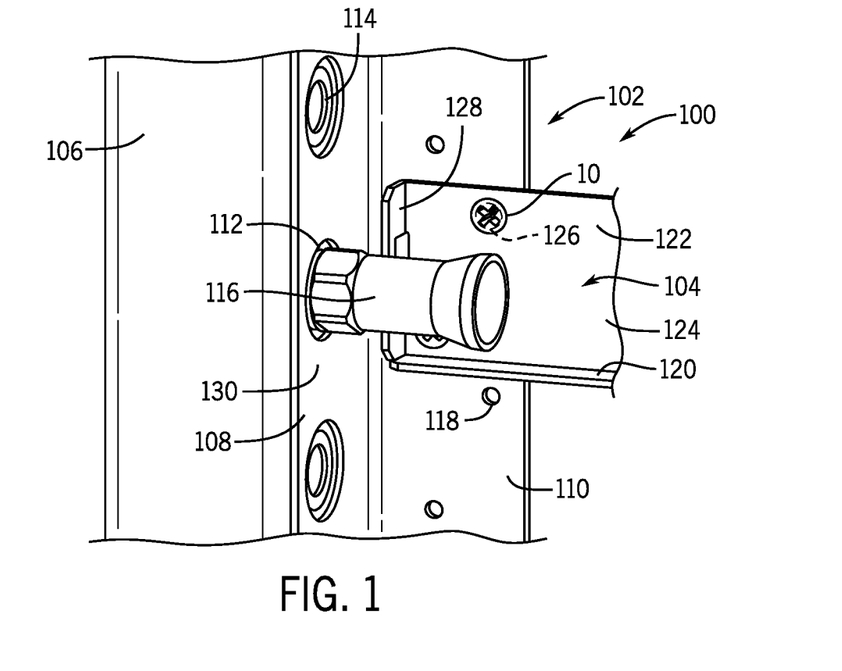
FIG. 1 is an isometric partial view of a manifold, a mounting and alignment interface, and a rack support according to an embodiment of the invention.

In the context of a server rack assembly 100, FIG. 1 illustrates an example mounting and alignment interface 102 for a rack support 104 and a manifold 106 for delivery of cooling flow to electronics (not shown) supported by the rack support 104. In the illustrated example, the mounting and alignment interface 102 has a first planar portion 108 extending perpendicular to a second planar portion 110. In some instances, the mounting and alignment interface 102 can formed from a unitary metal body 130, shown here as a piece of angle iron.

The first planar portion 108 has a plurality of alignment holes 112 positioned to align, respectively, with a plurality of port holes 114 along the manifold 106. The plurality of alignment holes 112 are sized to receive fluid ports 116 (shown in this case as quick-connect couplings). The fluid ports 116 are configured to be coupled to the manifold 106 at the plurality of port holes 114.

The second planar portion 110 has a plurality of placement features 118, shown here as apertures. Each of the plurality of placement features 118 are located at predetermined locations along the second planar portion 110, with predetermined spacing relative to the alignment holes 112. Other forms of placement features 118 are contemplated, for example, tabs or pins extending from the second planar portion 110. As shown here, adjacent placement features 118 are staggered along the second planar portion 110. However, other patterns are contemplated, for example, the placement features 118 can be aligned vertically or horizontally or both.

It is contemplated that the first planar portion 108 is welded to the manifold 106. Welding ensures maintained alignment of the plurality of alignment holes 112 and the plurality of port holes 116. Welding also reduces the amount of forces experienced by the manifold 106 from the flow of fluid and connection of the fluid ports 116, instead transferring the forces to the mounting and alignment interface 102 and the rack support 104. In other embodiments, however, a mounting and alignment interface may be otherwise secured to a manifold.

Figure 2:
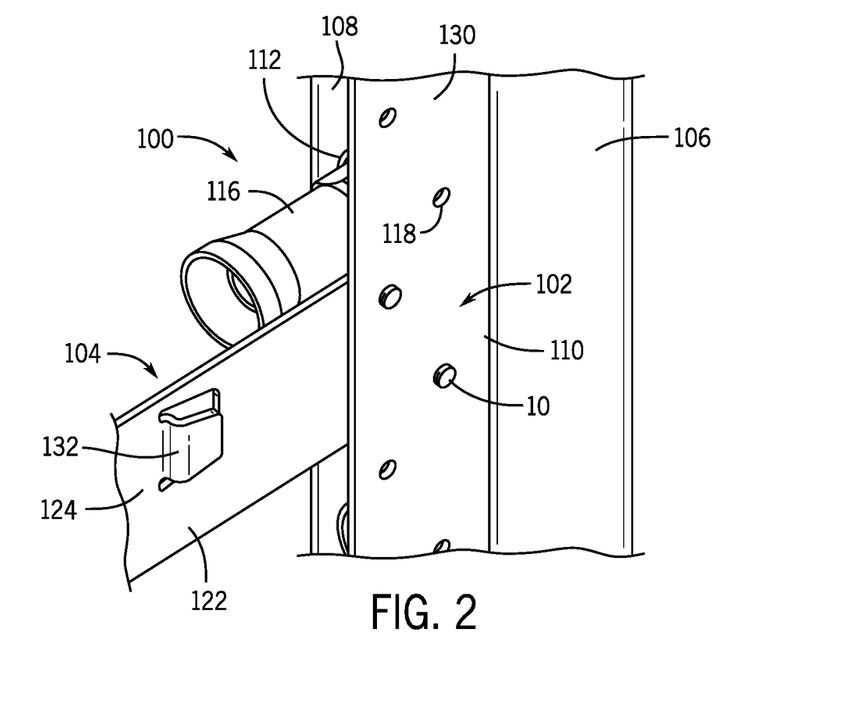
FIG. 2 is an isometric partial view of the manifold, mounting and alignment interface, and rack support of FIG. 1.
Figure 3:
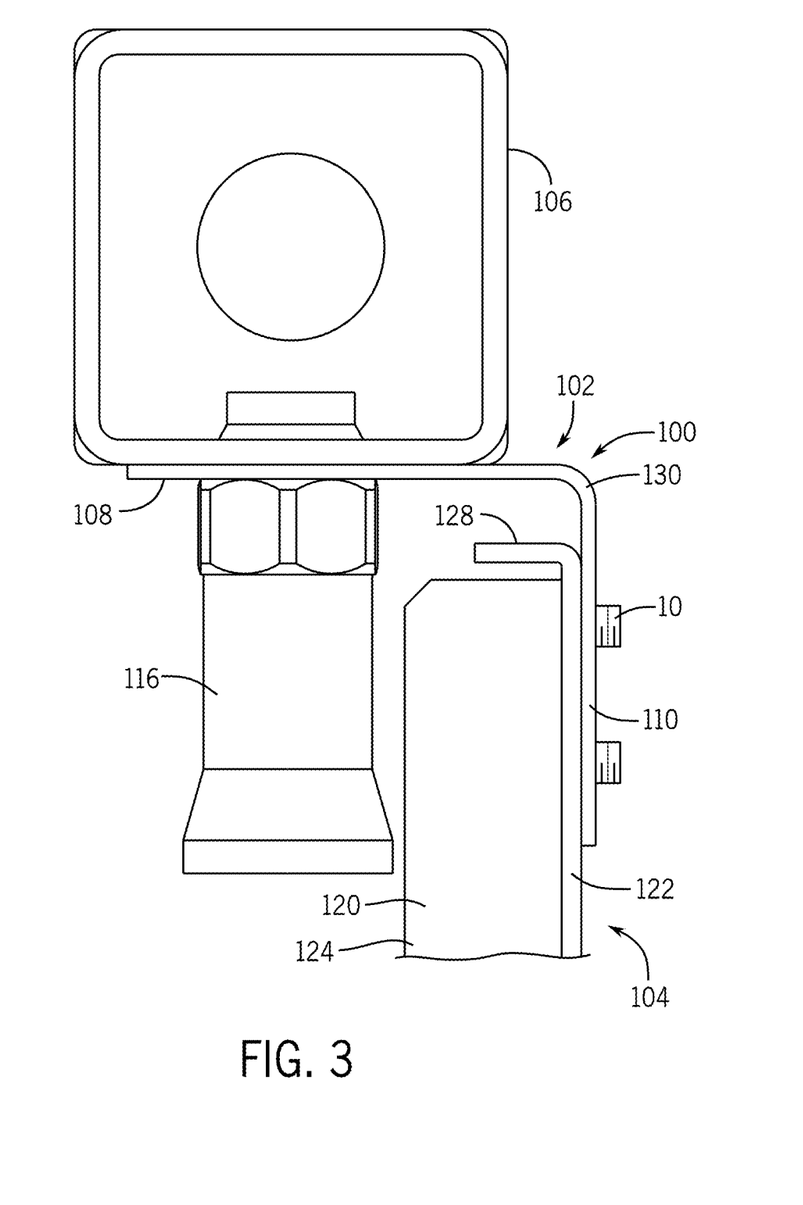
FIG. 3 is a top plan view of the manifold, mounting and alignment interface, and rack support of FIG. 1.

Continuing to look at FIGS. 1-3, the rack support 104 is also shown. The rack support 104 has a planar support surface 120 and a side portion 122. The rack support 104 is formed from a unitary sheet metal body 124. The planar support surface 120 and the side portion 122 are perpendicular to each other. The planar support surface 120 is configured to support an equipment rack (not shown). The side portion 122 has support features-, such as, for example, apertures 126.

The support features 126 are configured to align with a set of the plurality of placement features 118 of the mounting and alignment interface 102 to secure the rack support 104 to the mounting and alignment interface 102. For example, fasteners 10 can be received through the aligned support features 126 and the placement features 118. As shown in FIG. 1, two of the support features 126 are aligned with two of the plurality of placement features 118, so that two staggered fasteners can be used to align and secure the rack support 104 relative to the mounting and alignment interface 102.

The rack support 104 may also include other elements. For example, the rack support 104, as shown, has an equipment stop 128. The equipment stop 128 can be formed from a bent piece of the side portion 122 as shown here, can be a separate piece attached to the rack support 104 or the mounting and alignment interface 102, or can be otherwise formed. The equipment stop 128 allows equipment supported by the rack support 104 to be mated with the fluid port 116 but stops the insertion of the equipment or of a tray that supports the equipment (not shown) beyond a predetermined distance, such as may prevent additional pressure being applied to the manifold 106 or the fluid ports 116 during installation. The rack support 104 also has a tab 132 (shown in FIG. 2) extending outward from the side portion 122 in direction opposite the planar support surface 120. The tab 132 can be formed as a cutout of the material forming the side portion 122 as shown here or can be a separate piece attached to the side portion 122 and can help to secure and align supported equipment, while also providing for substantial vertical tolerances for this purpose.

Figure 4:
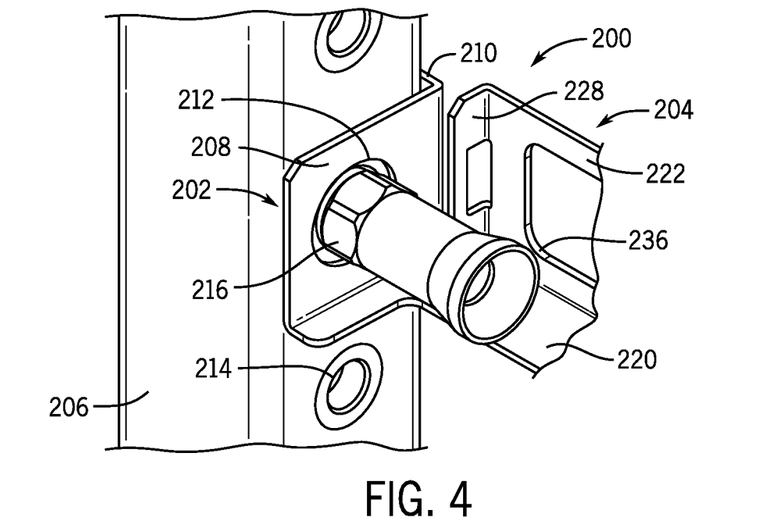
FIG. 4 is an isometric partial view of a manifold, a mounting and alignment interface, and a rack support according to another embodiment of the invention.
Figure 5:
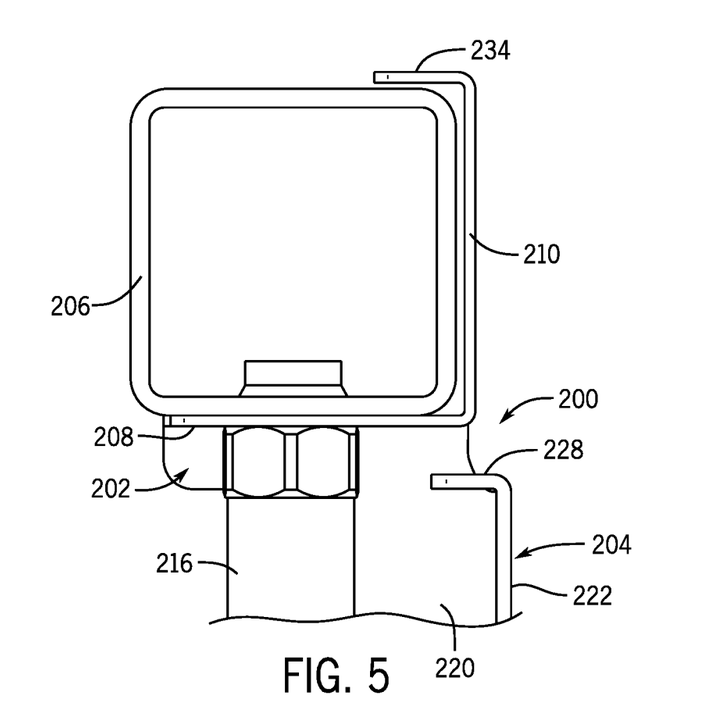
FIG. 5 is a top plan view of the manifold, mounting and alignment interface, and rack support of FIG. 4.

FIGS. 4 and 5 illustrate another embodiment of a server rack assembly 200 according to the invention, as also can be secured to a manifold 206. In many aspects, the server rack assembly 200 is similar to the server rack assembly 100 described above and similar numbering in the 200 series is used for the server rack assembly 200. For example, the server rack assembly 200 has a mounting and alignment interface 202 and a rack support 204. The mounting and alignment interface 202 has a first planar portion 208 with an alignment hole 212 and a second planar portion 210. A fluid port 216, configured here as a quick-connect fitting, is in fluid communication with the manifold 206 through a port hole 214 and the fluid port 216 extends through the alignment hole 212. The mounting and alignment interface 202 is configured to be welded to the manifold 206. The rack support 204 has a planar support surface 220, a side portion 222 perpendicular to the planar support surface 220, an equipment stop 228, and a tab for engaging supported electronics or electronics trays (not shown).

In some aspects, however, the server rack assemblies 100, 200 differ from each other. For example, the mounting and alignment interface 202 and the rack support 204 are made from one unitary piece of material (e.g., sheet metal). Additionally, the mounting and alignment interface 202 extends at least partially around the manifold 206, here shown extending approximately halfway around the manifold 206, from an outlet side of the manifold 206 that includes the fluid port 216 to an opposing side. Further, the second planar portion 210 extends alongside the manifold 206 in a direction opposite the rack support 204, and a third planar portion 234 extends perpendicularly from the second planar portion 210 and along the manifold 206 parallel with the first planar portion 208. The rack support 204 also has a window 236 extending though the side portion 222. The window 236 provides visual and physical access to the fluid port 216 before, during, and after installation of an equipment rack (not shown).

Figure 6:
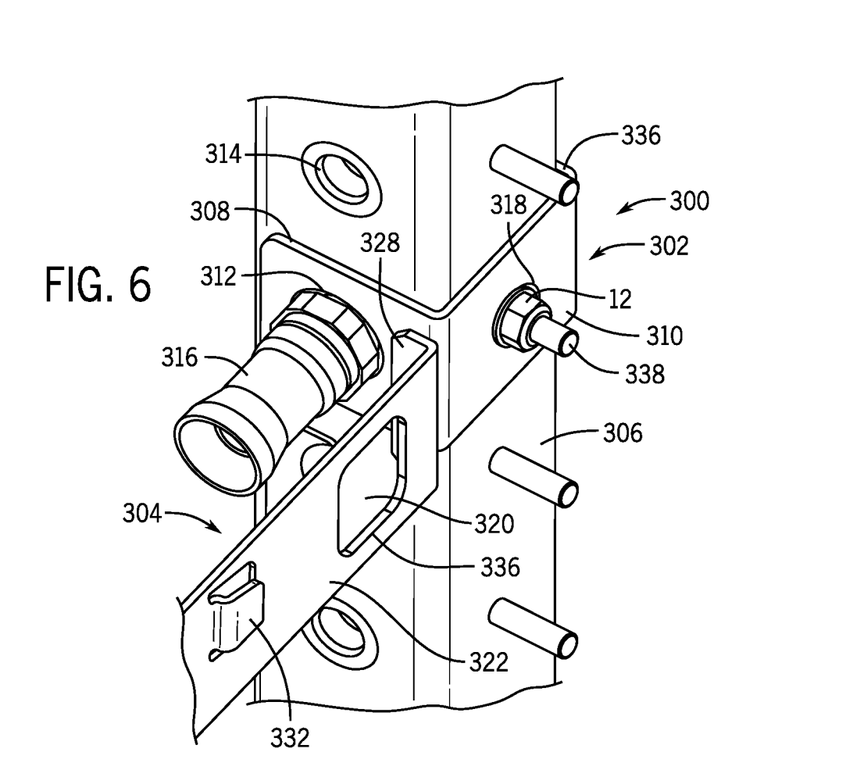
FIG. 6 is an isometric partial view of a manifold, a mounting and alignment interface, and a rack support according to another embodiment of the invention.
Figure 7:
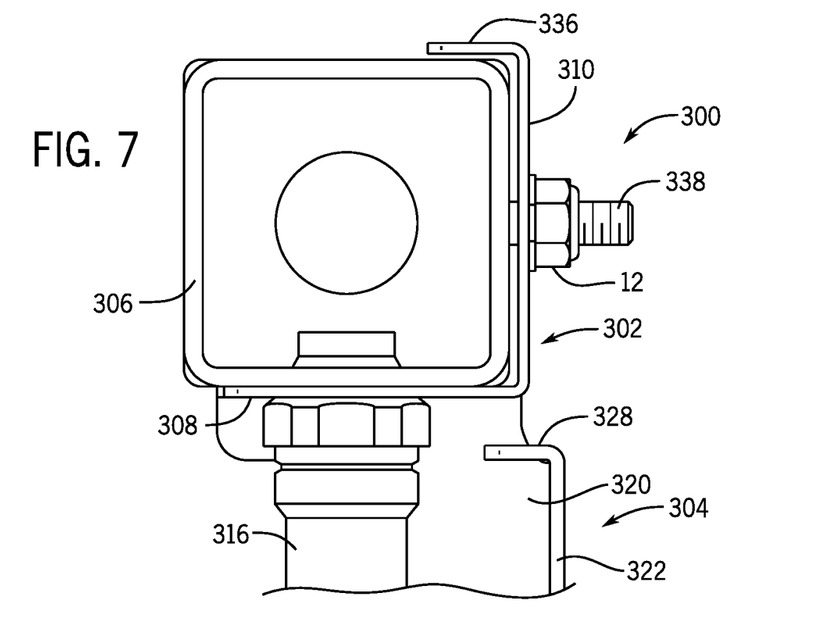
FIG. 7 is a top plan view of the manifold, mounting and alignment interface, and rack support of FIG. 6.

FIGS. 6 and 7 illustrate another embodiment of a server rack assembly 300 according to the invention, as also can be secured to a manifold 306. In many aspects, the server rack assembly 300 is similar to the server rack assembly 200 described above and similar numbering in the 300 series is used for the server rack assembly 300. For example, the server rack assembly 300 has a mounting and alignment interface 302 and a rack support 304 as part of a unitary piece of material. The mounting and alignment interface 302 extends approximately halfway around the manifold 306 and has a first planar portion 308 with an alignment hole 312, a second planar portion 310 extending along the manifold 306 in a direction opposite the rack support 304, and a third planar portion 334 extending perpendicularly from the second planar portion 310 and along the manifold 306 parallel with the first planar portion 308. A fluid port 316 is in fluid communication with the manifold 306 through a port hole 314 and the fluid port 316 extends through the alignment hole 312. The rack support 304 has a planar support surface 320, a side portion 322 perpendicular to the planar support surface 320, an equipment stop 328, a tab 332, and a window 336.

In some aspects, however, the server rack assemblies 300, 200 differ from each other. For example, the second planar portion 310 of the mounting and alignment interface 302 has a placement feature 318, here shown as a hole although other features, such as recesses or protrusions, are also possible. Additionally, a plurality of protrusions 338 are linearly spaced along the manifold 306 and extend outward perpendicularly from the manifold 306 with respect to the fluid port 316. The placement feature 318, as shown, is configured to receive one of the plurality of protrusions 338 therethrough. Each of the plurality of protrusions 338 can be threaded and configured to receive a nut 12. The nut 12 can be tightened to secure the server rack assembly 300 to the manifold 306. In some embodiments, the centers of the alignment hole 312 and the placement feature 318 are coplanar. In some embodiments, other alignment arrangements, such as holes or detents on a manifold and protrusions on a mounting and alignment feature, can be used.

Figure 8:
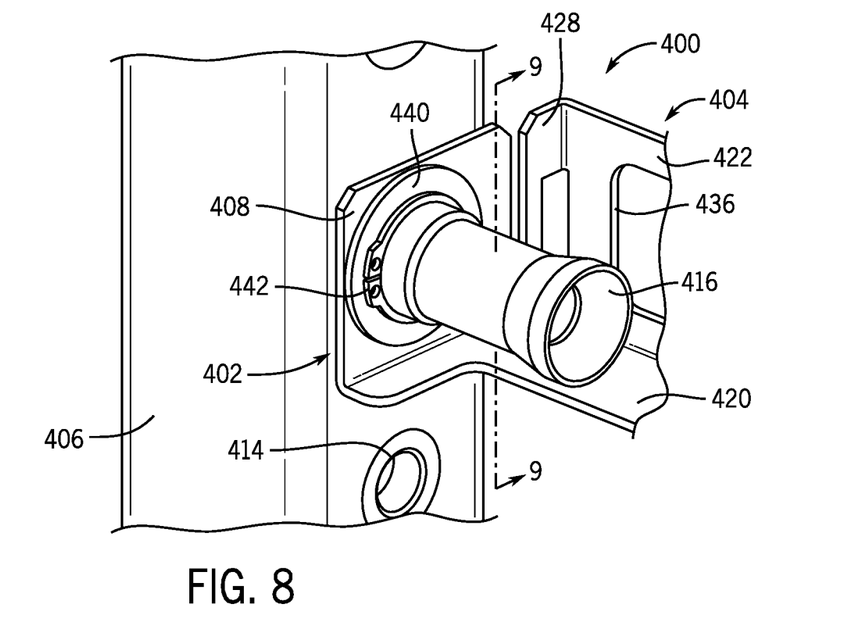
FIG. 8 is an isometric partial view of a manifold, a mounting and alignment interface, and a rack support according to another embodiment of the invention.
Figure 9:
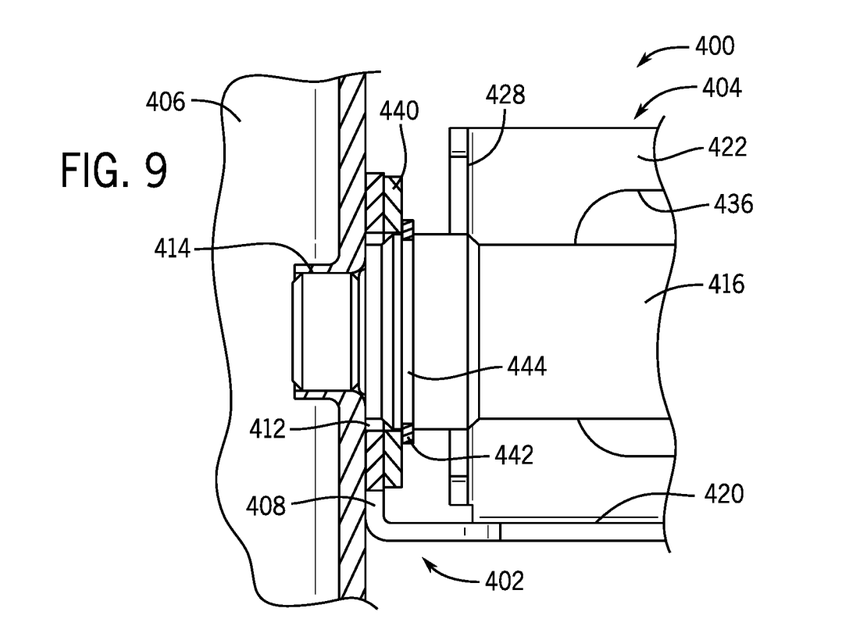
FIG. 9 is a cross-sectional view of the manifold, alignment interface, and rack support of FIG. 8 along line 9-9 in FIG. 8.

FIGS. 8 and 9 illustrate another embodiment of a server rack assembly 400 according to the invention, as also can be secured to a manifold 406. In many aspects, the server rack assembly 400 is similar to the server rack assembly 100 described above and similar numbering in the 400 series is used for the server rack assembly 400. For example, the server rack assembly 400 has a mounting and alignment interface 402 and a rack support 404. The mounting and alignment interface 402 has a first planar portion 408 with an alignment hole 412. A fluid port 416 is in fluid communication with the manifold 406 through a port hole 414 and the fluid port 416 extends through the alignment hole 412. The rack support 404 has a planar support surface 420, a side portion 422 perpendicular to the planar support surface 420, an equipment stop 428, and a tab (not shown).

In some aspects, however, the server rack assemblies 100, 400 differ from each other. For example, the mounting and alignment interface 402 and the rack support 404 are made from one unitary piece of material (e.g., sheet metal). Further, the mounting and alignment interface 402 is directly coupled to the fluid port 416. A spacer 440 is positioned around the fluid port 416 between the first planar portion 408 of the mounting and alignment interface 402 and a snap-ring 442. The snap-ring 442 is received within an external groove 446 of the fluid port 416. The mounting and alignment interface 402 is thereby sandwiched between the manifold 406 and the snap-ring 442. The spacer 440 is sized to take up space between the snap-ring 442 and the first planar portion 408 to provide a secure fit.

Figure 10:
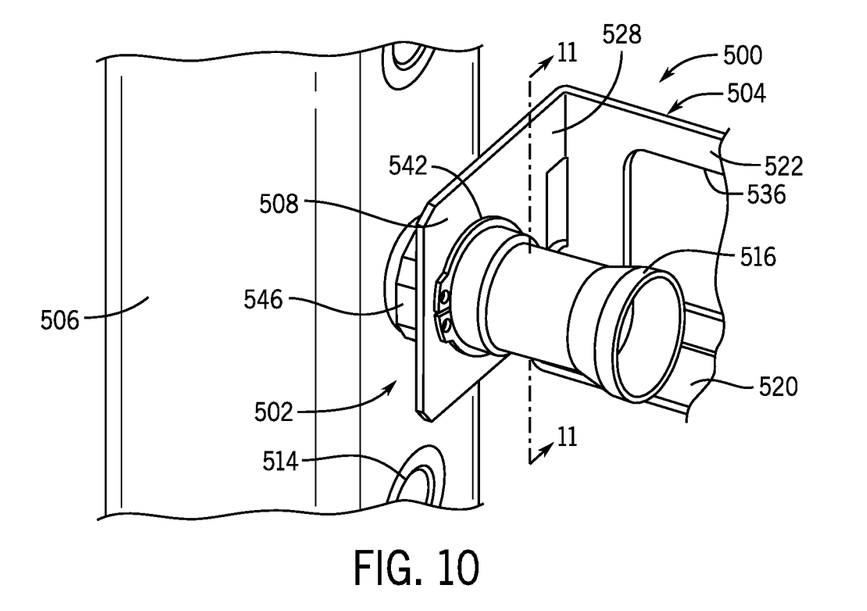
FIG. 10 is an isometric partial view of a manifold, a mounting and alignment interface, and a rack support according to another embodiment of the invention.
Figure 11:
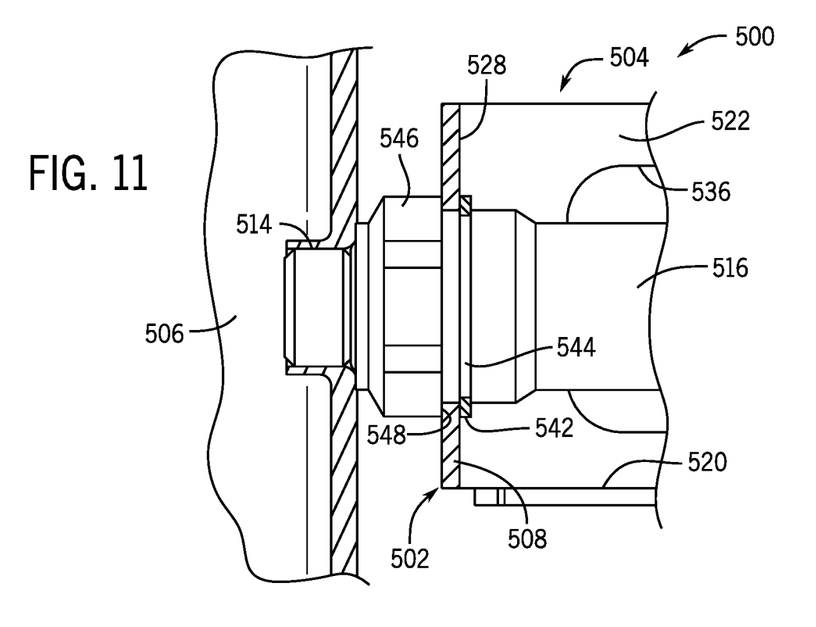
FIG. 11 is a cross-sectional view of the manifold, mounting and alignment interface, and rack support of FIG. 10 along line 11-11 in FIG. 10.

FIGS. 10 and 11 illustrate another embodiment of a server rack assembly 500 according to the invention, as also can be secured to a manifold 506. In many aspects, the server rack assembly 500 is similar to the server rack assembly 400 described above and similar numbering in the 500 series is used for the server rack assembly 500. For example, the server rack assembly 500 has a mounting and alignment interface 502 and a rack support 504 as part of a unitary piece of material. The mounting and alignment interface 502 has a first planar portion 508 with an alignment hole 512. A fluid port 516 is in fluid communication with the manifold 506 through a port hole 514 and the fluid port 516 extends through the alignment hole 512. The rack support 504 has a planar support surface 520, a side portion 522 perpendicular to the planar support surface 520, and a tab (not shown). Also, the mounting and alignment interface 502 is directly coupled to the fluid port 516.

In some aspects, however, the server rack assemblies 400, 500 differ from each other. For example, the server rack assembly 500 is spaced from the manifold 506 when installed. As generally noted above, this arrangement can help to isolate the manifold 506 from certain forces, due to the direct connection between the mounting and alignment interface 502 and the fluid port 516. In particular, in the illustrated example, the fluid port 516 has a collar 546 with a shoulder 548 adjacent an external groove 544. The fluid port 516 is received through the alignment hole 512 of the first planar portion 508 beyond the external groove 544 and up to the collar 546. A snap ring 542 is received within the external groove 544 and urges the first planar portion 508 against the shoulder 548 to provide a secure fit of the server rack assembly 500 spaced away from the manifold 506. Additionally, an equipment stop 528 is integrated with the first planar portion 508 of the mounting and alignment interface 502 because the spaced relationship between the manifold 506 and the first planar portion 508 places the first planar portion 508 at a position at which the electronics tray (not shown) is to be stopped during installation.

In other embodiments, other configurations are possible. For example, certain features and combinations of features that are presented with respect to particular embodiments in the discussion above can be utilized in other embodiments and in other combinations, as appropriate.

In some implementations, devices or systems disclosed herein can be utilized or installed using methods embodying aspects of the invention. Correspondingly, description herein of particular features or capabilities of a device or system is generally intended to inherently include disclosure of a method of using such features for intended purposes and of implementing such capabilities. Similarly, express discussion of any method of using a particular device or system, unless otherwise indicated or limited, is intended to inherently include disclosure, as embodiments of the invention, of the utilized features and implemented capabilities of such device or system.

Thus, embodiments of the invention can provide improved interfaces between electronics trays that are to be cooled by a liquid flow and manifolds that provide the liquid flow to the electronics trays. In some embodiments, for example, mounting and alignment features that attach to the manifold or the fluid ports can help to align and secure an electronics tray with a known spacing, along three (e.g., Cartesian) axes, relative to fluid ports on a manifold as may help to ensure appropriate connection of fluid ports on the electronics tray to the fluid ports on the manifold (e.g., for engagement of quick-connect couplings).

The previous description of the disclosed embodiments is provided to enable any person skilled in the art to make or use the invention. Various modifications to these embodiments will be readily apparent to those skilled in the art, and the generic principles defined herein may be applied to other embodiments without departing from the spirit or scope of the invention. Thus, the invention is not intended to be limited to the embodiments shown herein but is to be accorded the widest scope consistent with the principles and novel features disclosed herein.

What is claimed is:

1. A server rack assembly for supporting an electronics tray and aligning the electronics tray with a manifold for delivery of cooling flow to the electronics tray, the manifold including at least one fluid port, the server rack assembly comprising:
    a mounting and alignment interface having a first planar portion secured to and arranged parallel to the manifold with an alignment hole of the first planar portion arranged around a port hole of the manifold, the alignment hole configured to receive the at least one fluid port therethrough;
    a rack support coupled to the mounting and alignment interface, the rack support having a support shelf configured to receive the electronics tray thereon and a side portion extending perpendicularly from and along the support shelf; and
    an equipment stop formed from the side portion of the rack support and extending perpendicular to the side portion of the rack support, the equipment stop configured to prevent the electronics tray from being installed beyond a predetermined distance.

2. The server rack assembly of claim 1, wherein the mounting and alignment interface is directly coupled to the manifold.

3. The server rack assembly of claim 1, wherein the mounting and alignment interface and the rack support are formed from a unitary metal body.

4. The server rack assembly of claim 1, wherein the mounting and alignment interface has a second planar portion extending alongside the manifold in a direction opposite the rack support.

5. The server rack assembly of claim 4, wherein the second planar portion includes a placement feature configured to receive a protrusion extending outwardly from the manifold perpendicular to the fluid port.

6. The server rack assembly of claim 5, wherein the protrusion is threaded and the second planar portion is configured to be urged against the manifold by a nut threadably engaged with the protrusion.

7. The server rack assembly of claim 1, wherein the mounting and alignment interface is mounted and retained on the fluid port.

8. A server rack assembly for supporting an electronics tray and aligning the electronics tray with a manifold for delivery of cooling flow to the electronics tray, the server rack assembly comprising:
    a mounting and alignment interface secured to the manifold with a first planar portion arranged parallel to the manifold with an alignment hole of the first planar portion aligned with a port hole of the manifold to permit a fluid port to extend from the port hole of the manifold away from the mounting and alignment interface in a first direction and through the alignment hole;
    a rack support coupled to the mounting and alignment interface and extending away from the mounting and alignment interface in the first direction, the rack support having a support shelf configured to receive the electronics tray;
    the mounting and alignment interface and the rack support being configured to align and secure the electronics tray with a known spacing, relative to the fluid port to ensure appropriate connection of a fluid port on the electronics tray to the fluid port on the manifold.

9. The server rack assembly of claim 8, wherein the mounting and alignment interface and the rack support are made from a unitary piece of material.

10. The server rack assembly of claim 9, wherein the mounting and alignment interface has a second planar portion configured to extend alongside the manifold in a direction opposite the rack support.

11. The server rack assembly of claim 10, wherein the second planar portion of the mounting and alignment interface has an aperture configured to receive a protrusion extending outwardly from the manifold.

12. The server rack assembly of claim 11, wherein the protrusion is threaded and the second planar portion is configured to be urged against the manifold and secured there against a nut threadably engaged with the protrusion.

13. The server rack assembly of claim 8, wherein the rack support has a side portion extending perpendicularly from and along the support shelf and an equipment stop coupled to and extending perpendicularly from the side portion, the equipment stop configured to prevent the electronics tray from being installed beyond a predetermined distance.

14. The server rack assembly of claim 13, wherein the rack support is configured to be coupled to the mounting and alignment interface with a set of fasteners received within respective sets of placement apertures in the rack support and the mounting and alignment interface.

15. The server rack assembly of claim 14, wherein the sets of placement apertures of the rack support and the mounting and alignment interface are spaced apart in a staggered pattern.

16. The server rack assembly of claim 13, wherein the rack support has a window in the side portion, and with the server rack coupled to the manifold, the window is located adjacent the fluid port to provide visual access to the fluid port before, during, and after installation of the electronics tray.

17. A server rack assembly for supporting an electronics tray, the server rack assembly comprising:

a manifold defining a port hole with a fluid port extending outward therefrom in a first direction and configured to be compatible with a fluid port on the electronics tray;

a mounting and alignment interface arranged parallel to the manifold, the mounting and alignment interface having an alignment hole concentric with the port hole of the manifold and configured to receive the fluid port of the manifold therethrough;

a rack support coupled to the mounting and alignment interface and extending outward therefrom in the first direction, the rack support having a support shelf configured to receive the electronics tray thereon;

the mounting and alignment interface and the rack support being configured to align the fluid port of the manifold with the fluid port of the electronics tray during installation of the electronics tray on the rack support.

18. The server rack assembly of claim 17, wherein the rack support has a side portion extending perpendicularly from and along the support shelf and an equipment stop coupled to and extending perpendicularly from the side portion, the equipment stop configured to prevent the electronics tray from being installed on the rack support beyond a predetermined distance.

19. The server rack assembly of claim 18, wherein the mounting and alignment interface is mounted and retained on the fluid port of the manifold.

20. The server rack assembly of claim 18, wherein the manifold has a protrusion that is configured to be received within an aperture of the mounting and alignment interface to place the rack support at a predetermined location relative to the fluid port of the manifold to ensure alignment with the fluid port of the electronics tray.

\* \* \* \* \*